United States Patent [19]

Tanzer et al.

[11] Patent Number: 5,349,498
[45] Date of Patent: Sep. 20, 1994

[54] INTEGRAL EXTENDED SURFACE COOLING OF POWER MODULES

[75] Inventors: Herbert J. Tanzer, Topanga; Gholam A. Goodarzi, Torrance; Richard J. Olaveson, Inglewood, all of Calif.

[73] Assignee: Hughes Aircraft Company, Los Angeles, Calif.

[21] Appl. No.: 995,444

[22] Filed: Dec. 23, 1992

[51] Int. Cl.$^5$ ............................................. H05K 7/20
[52] U.S. Cl. ................................. 361/689; 174/16.3; 165/80.4; 257/714; 361/699; 361/707
[58] Field of Search ................. 174/16.3; 165/80.4, 165/104.33, 185; 257/714; 361/382, 384, 338

[56] References Cited

U.S. PATENT DOCUMENTS

| | | | |
|---|---|---|---|
| 3,788,393 | 1/1974 | Plizak | 165/80.4 |
| 4,652,970 | 3/1987 | Watari et al. | 361/385 |
| 4,782,893 | 11/1988 | Thomas | 174/16.3 |
| 4,805,691 | 2/1989 | Cook et al. | 361/385 |
| 5,043,845 | 8/1991 | McDermott et al. | 361/384 |
| 5,046,552 | 9/1991 | Tousignant | 361/385 |
| 5,070,936 | 12/1991 | Carroll et al. | 165/80.4 |

FOREIGN PATENT DOCUMENTS 2543075  7/1976  Fed. Rep. of Germany ...... 361/385

Primary Examiner—Gregory P. Thompson
Attorney, Agent, or Firm—Leonard A. Alkov; W. K. Denson-Low

[57] ABSTRACT

The semiconductor wafer of the power module is mounted directly, separated only by thermal expansion control layers and insulator layers, on the metal base which has fins or pins integrally formed thereon. This module is mounted on a coolant fluid flow chamber so that the module mounting is not a thermal interface. In this way, maximum power module cooling is achieved with minimum fluid flow.

7 Claims, 2 Drawing Sheets

INTEGRAL EXTENDED SURFACE COOLING OF POWER MODULES

FIELD OF THE INVENTION

This invention is directed to the structure of an electronic power module which has its wafer mounted directly (except for thermal expansion and insulating layers) on the base, and the base has extended cooling surface thereon. The module is directly mounted on a coolant fluid flow chamber with the extended surface in the chamber to minimize thermal resistance between the wafer and the coolant fluid.

BACKGROUND OF THE INVENTION

Semiconductor electronic devices have internal losses which generate heat in use. When the electronic device is configured for a substantial amount of power, cooling is necessary in order to limit the semiconductor device to a sufficiently low temperature to provide a reasonable life. Power modules containing this type of semiconductor component are traditionally attached to a cold plate. The cold plate may have fins thereon with circulation of fluid therepast. The fluid is usually liquid when greater amounts of heat must be dissipated. As long as there is sufficient power to provide more flow of liquid, such a cooling system is satisfactory.

A commonly used current method for cooling high-density hybrid power modules is by clamping them onto a typical internally finned flow-through cold plate. Characteristics of the thermal interface between the module and the cold plate are dependent on numerous variables such as surface finish and roughness, bolt torque, pressure uniformity, interface material conductivity and consistency, and the type of interface material such as gasket, grease or foil. In addition, thermal expansions and contractions, vibration, shock and handling will often vary the initial parameters and cause performance degradation. Typical finned flowthrough cold plates are constructed of aluminum material for manufacturing reasons. The mismatch in thermal expansion rates between the aluminum cold plate and the module base plate creates additional degradation at the thermal interface.

The dissipated power density of present-day power hybrid modules has reached a nominal 500 watts per square inch at the semiconductor chip. Current package power modules are clamped or bolted with the module base plate against the cold plate. The cold plate may have internal passages for fluid flow and internal fins for increased cold plate-liquid coolant interface area. This structure requires the cold plate of minimum thermal resistance and an interface between the power module base plate and the cold plate also of minimum thermal resistance. Achieving flatness is difficult, and tight bolting causes distortion. Thus, there is need for an improved structure by which the semiconductor devices can be cooled with a minimum amount of coolant power.

SUMMARY OF THE INVENTION

In order to aid in the understanding of this invention, it can be stated in essentially summary form that it is directed to an electronic power module which has extended cooling surface on its base plate, and there is a minimum number of layers between the semiconductor and wafer to minimize thermal resistance.

It is thus a purpose and advantage of this invention to provide a power module which has a metallic base plate therein with an electronic semiconductor wafer mounted on the base plate on a minimum number of interface layers, and the base plate carries integrally formed fins or pins which are immersed in liquid in a cold plate.

It is another purpose and advantage of this invention to provide an integral fin-cooling system for power modules which incorporates cooling fins integral to the base plate of the power module so that the fins or pins can be bathed in cooling fluid to cool the semiconductor wafer.

It is a further purpose and advantage of this invention to provide a power module having integral fins or pins thereon so that thermal resistance is minimized and liquid coolant can cool the fins or pins with a minimum expenditure of pumping power.

It is another purpose and advantage of this invention to provide direct contact between fins or pins on the base plate of a power module with the liquid in a cold plate so that the cold plate need not be made of low thermal resistance materials or with high accuracy at the power module mounting face.

Other purposes and advantages of this invention will become apparent from a study of the following portion of the specification, the claims and the attached drawings wherein:

DESCRIPTION OF THE PREFERRED EMBODIMENT

Figure 1:
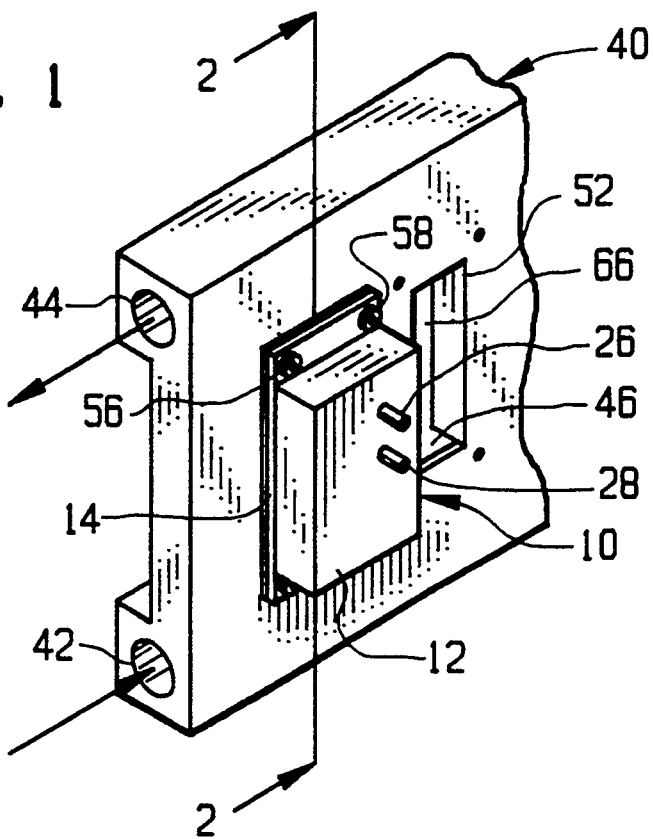
FIG. 1 is an isometric view of a cooling system including a power module having integral fins on its base plate mounted on a cold plate, with the fins inserted in the fluid passage.
Figure 2:
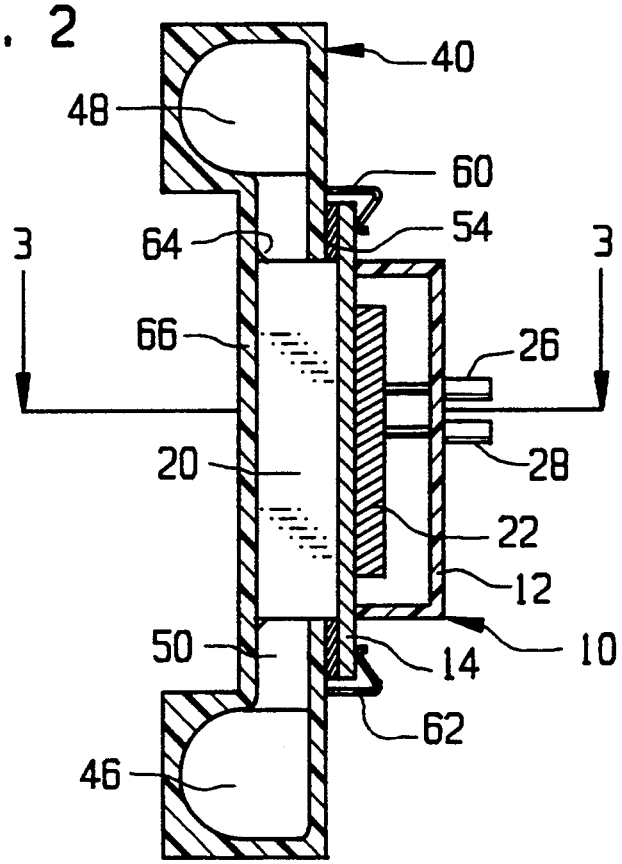
FIG. 2 is an enlarged section taken generally along line 2—2 of FIG. 1.
Figure 3:
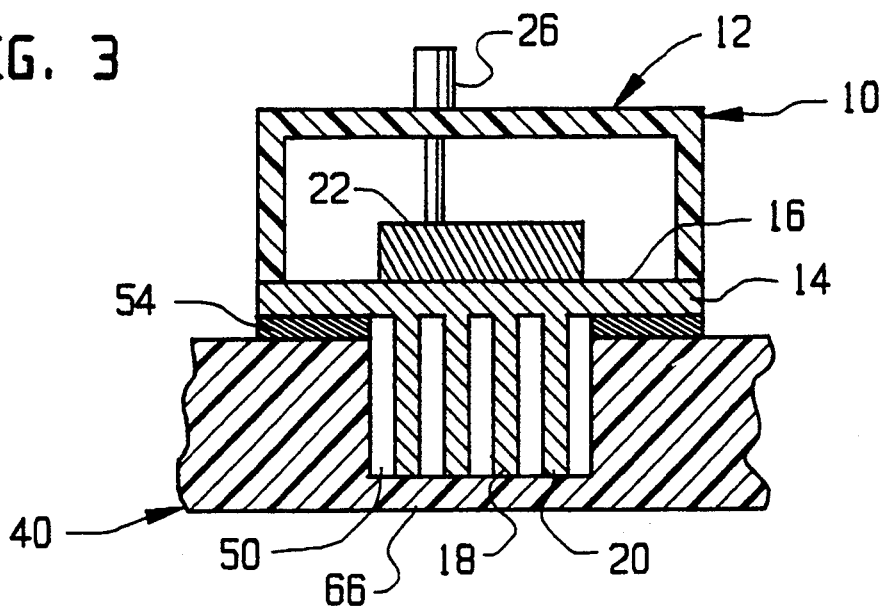
FIG. 3 is a section taken generally along line 3—3 of FIG. 2.

A power module configured in accordance with this invention is generally indicated at 10 in FIGS. 1, 2 and 3. In FIG. 3, the near side of the cover 12 is broken away to schematically illustrate the equipment therein. The power module 10 comprises a base 14 which has an upper mounting surface 16 and which has a plurality of fins integrally formed therewith and extending out of the base on the side opposite the mounting surface. Fins 18 and 20 are specifically identified in FIG. 3, but it is seen that the fins are positioned under the active area of the upper mounting surface. The base 14 is sufficiently wide so that it can serve as an overlap mounting flange against the cold plate, as is described hereafter. The cover 12 is preferably of a dielectric material or has dielectric feedthroughs therethrough. The cover is secured to the outer edges of the base 14 at the sides, as seen in FIGS. 1 and 2, but is short of the ends of the base to expose a securing flange, as seen in FIGS. 1 and 2. If desired, the cover could be narrower, in the direction seen in FIG. 3, to leave an exposed securing flange all the way around.

Mounted on top of the active area of the upper surface is the electronic stack indicated at 22 in FIG. 3. As previously indicated, the lowermost layer is the base 14. This is preferably a copper layer to achieve high thermal conductivity in a relatively inexpensive metal. Appropriate intermediate layers are provided between the semiconductor wafer and the copper base layer 14 in order to provide security of mounting, maximize heat transfer, minimize stresses in the wafer caused by differential expansion of the materials, and provide electrical insulation where necessary. The wafer in the stack has semiconductor electronic components therein, and particularly high-power electronics together with control components for controlling the main power flow. Principal electronic connections 26 and 28 are shown as the power connections to the power junctions in the module. These electrical connections are shown as extending out of the top of the cover for external connection. In addition, the control connections are brought out of the cover in a similar way, but with suitably smaller conductors. The semiconductor devices in the silicon wafer generate the heat which must be extracted to maintain the silicon wafer at a sufficiently low temperature that it remains operative over a long life. The heat is conducted downward through the stacks to the base layer 14. The base layer 14 has the plurality of fins thereon under the active area of the upper mounting surface.

Cold plate 40, see FIGS. 1, 2 and 3, has a fluid inlet 42 and a fluid outlet 44, see FIG. 1. The inlet and outlet are respectively connected to inlet passage 46 and outlet passage 48. There are one or more channels in the cold plate depending on how many power modules 10 are to be mounted on each cold plate. As illustrated in FIG. 1, there are two channels in the cold plate 40. The first is channel 50 on which the module 10 is mounted, and there is also a channel 52 on which no power module is mounted for illustration purposes. In use, all channels would be covered. Furthermore, FIG. 1 is shown as being broken away so that the cold plate 40 may be longer in the upper right direction so as to provide the desired number of channels to accommodate the desired number of power modules. Since the cold plate 40 has no need for providing low resistance thermal connections, flatness is not a problem, and it can be made out of any convenient material, such as die-cast aluminum or molded synthetic polymer composition material. The modules are mounted on the cold plate with a gasket 54 therebetween to avoid coolant leakage out of the face of the cold plate. There is no need for the extra special flat surfaces required for thermal interface, but the surfaces need only be flat enough for sealing with the gasket. The power modules are held in place on the face of the cold plate by any convenient means. Machine screws 56 and 58 are illustrated in FIG. 1, and spring clamps 60 and 62 are illustrated in FIG. 2 as additional and/or alternate means for securing the power module on the cold plate.

The fins and channels are sized so that the fins reach all the way to the bottom of the channel, as seen in FIGS. 2 and 3. The fins may be attached by any convenient means, such as adhesive 64, if desired. When not adhesively attached, the modules are more easily replaced. When they are attached, then the back wall 66 is supported better and fluid flow beyond the ends of the fins is illuminated.

Figure 4:
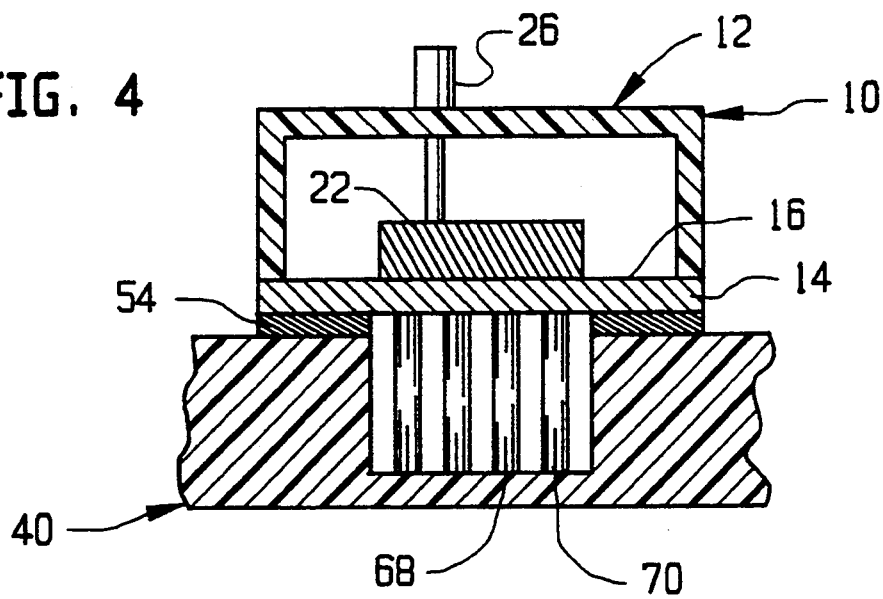
FIG. 4 is a section similar to FIG. 3 showing pins as providing the extended surface.

FIG. 4 illustrates the same structure except that pins are used instead of fins. Pins are employed as an alternate way of extending the surface. The parts are the same as in FIG. 3, except for the presence of fins instead of pins. Pins 68 and 70 are particularly identified. The pins are preferably integrally formed with the base 14 for maximum thermal transfer, but may be separate pins pressed into holes in the base. The pins are simply a special configuration of the fins. When a power module is attached to each channel and secured and gasketed in place, coolant liquid delivered into fluid inlet 42 travels through inlet passage 46 and thence up the channels 50 and 52 between the fins or pins integrally formed on base 14. The spent coolant liquid is collected in outlet passage 48 and discharged at fluid outlet 44. The coolant fluid is preferably air-cooled and pumped back into inlet 42. The liquid flow is controlled so that it all passes through the channels 50 and 52 and related channels. The fluid in each channel directly cools the base plate of the associated power module. A minimum thermal resistance is achieved, and this minimizes the coolant fluid pumping requirement.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A power module cooling system comprising:
   a cold plate comprising a fluid inlet and a fluid outlet, a channel interconnecting said fluid inlet and said fluid outlet, and a mounting face having an opening therein into said channel;
   a power module disposed on said cold plate, said power module comprising a metallic base that is larger than said opening in said mounting face of said cold plate so that said metallic base overlies said cold plate around said opening to seal against said cold plate adjacent said opening, said metallic base comprising metallic fins that are disposed through said opening in said face of said cold plate into said channel so that coolant fluid flow through said cold plate passes said fins wherein said fins are secured to a side of said channel opposite said opening into said channel, said metallic base comprising a mounting face on said metallic base opposite said fins; and
   a semiconductor wafer disposed on said mounting face of said metallic base so that heat generated in said semiconductor wafer moves directly through said metallic base and said fins into said coolant fluid in said channel.

2. The system of claim 1 wherein said base is removably secured to said cold plate to provide for interchangeability of said base and said semiconductor wafer disposed thereon.

3. The system of claim 1 wherein a cover is mounted on said base, said cover being positioned to extend over said semiconductor wafer.

4. The system of claim 3 wherein said cover comprises dielectric material.

5. The system of claim 1 wherein said power module is removably mounted on said mounting face of said cold plate.

6. The system of claim 1 wherein a gasket is incorporated with said power module and said face of said cold plate which is used to assist in sealing against said cold plate adjacent said opening to eliminate coolant leaks out of said opening in said mounting face of said cold plate.

7. The system of claim 1 wherein said semiconductor wafer comprises a plurality of layers to electrically insulate said wafer from said base and to accommodate for differences in thermal coefficients of expansion between said wafer and said base.

* * * * *